United States Patent [19]

Kawai

[11] Patent Number: 4,742,313

[45] Date of Patent: May 3, 1988

[54] PHASE-LOCKED LOOP CIRCUIT HAVING A MECHANISM FOR PREVENTING ERRONEOUS OPERATION

[75] Inventor: Hisashi Kawai, Yokohama, Japan

[73] Assignee: Canon Kabushiki Kaisha, Tokyo, Japan

[21] Appl. No.: 936,847

[22] Filed: Dec. 2, 1986

[30] Foreign Application Priority Data

Dec. 3, 1985 [JP] Japan .................................. 60-270762

[51] Int. Cl.$^4$ .............................................. H03L 7/08
[52] U.S. Cl. ....................................... 331/1 A; 331/8; 331/17; 331/25
[58] Field of Search ...................... 331/1 A, 14, 16, 17, 331/25, 8

[56] References Cited

U.S. PATENT DOCUMENTS 4,626,797 12/1986 Sakata ................................. 331/1 A Primary Examiner—Eugene R. Laroche
Assistant Examiner—Robert J. Pascal
Attorney, Agent, or Firm—Robin, Blecker & Daley

[57] ABSTRACT

There is disclosed a phase-locked loop circuit for obtaining an output in phase with an incoming signal including a phase comparator arranged to compare phases of incoming two pulse signals to detect a phase difference between them only during a predetermined time in every period of one of said incoming pulse signals and to produce an output signal corresponding said phase difference and a controlled oscillator arranged to produce an output having an output frequency varying in accordance with the output signal of said phase comparator. According to the phase-locked loop circuit as disclosed, a pulse signal having a frequency produced by frequency division of said output frequency and a constant pulse width is formed and this pulse signal is fed to said phase comparator as the other one of said incoming pulse signals, whereby the occurrence of a false locked state is prevented.

13 Claims, 4 Drawing Sheets

PHASE-LOCKED LOOP CIRCUIT HAVING A MECHANISM FOR PREVENTING ERRONEOUS OPERATION

BACKGROUND OF THE INVENTION

1. Field of the Invention

The present invention relates to a phase-locked loop circuit (hereinafter, referred to as PPL circuit) and, particularly, it relates to a PPL circuit having a phase comparator which is arranged to compare two incoming pulse signals and to produce an output signal, only during a time of predetermined length in every period of one of said two pulse signals, said output signal being at a level varying in accordance with a level of the other of said pulse signals.

2. Description of the Related Art

The prior art will be described with reference to FIG. 5, which is a block diagram of the conventional PLL circuit of this kind.

The circuit shown in FIG. 5 includes a synchronizing separator circuit 1 for separating a synchronizing signal out of an incoming signal, a phase comparator 2 arranged to compare two incoming signals and to produce an output voltage which varies, during a time when one of the two incoming signals is at L (low) level, according to high or low level of the other of said two incoming signals, a low pass filter and phase compensating filter 3 (hereinafter referred to as LPF/PCF), an amplifier 4 (hereinafter referred to as AMP), a voltage-controlled oscillator 5 (hereinafter referred to as VCO) having an output frequency which varies according to an output voltage of said AMP 4, and a frequency divider 6 arranged to effect 1/n frequency division of the output of said VCO 5.

FIG. 6 is a timing chart showing wave forms of signals at several parts in FIG. 5.

FIG. 6 A2 illustrate the wave forms generated when the PLL circuit shown in FIG. 5 operates in normal manner and B2 and C2 illustrate the wave forms generated when the PLL circuit operates in undesirable manner.

Referring to FIG. 5, it is now assumed that a video signal, for example a NTSC signal, is fed to the synchronizing separator circuit 1. The circuit 1 operates to separate a horizontal synchronizing signal and to feed a signal (a) to the phase comparator 2. The signal (a) becomes at L (low) level for a predetermined time, in synchronized relationship with a drop-off of the horizontal synchronizing signal, as shown in FIG. 6. The phase comparator, which received the signal (a), produces an output voltage signal (c), which becomes lower during a period when another incoming signal (b) is at H (high) level while said signal (a) is at L level and which becomes higher during a period when said another incoming signal (b) is at L level while the signal (a) is at L level. Depending upon these signals (a) and (b), the phase comparator 2 produces the output signal (c) having the wave form as shown in FIG. 6 A2. The signal (c) is transmitted through the LPF/PCF 3 and AMP 4 to the VCO 5, which is driven thereby. An output signal of the VCO 5 is frequency-divided to 1/n by the frequency divider 6 and an output of this frequency divider forms the other incoming signal of the phase comparator 2, as mentioned above.

The above-described PLL circuit per se forms a subject of a co-pending U.S. patent application Ser. No. 659,717, which was field on Oct. 11, 1984 and assigned to the assignee of the present invention. Such application issued on Dec. 2, 1986 as U.S. Pat. No. 4,626,797.

According to the construction of the PLL circuit as described above, the phase comparator 2 may produce an output of undesirable wave form at the time of closing a power source switch. The wave form as shown by (c) in FIG. 6 B2 may be generated when the output frequency of the frequency divider 6 is small, while the wave form as shown in (c) of FIG. 6 C2 may be generated when the output frequency of the frequency divider 6 is large. When such wave forms are generated, the PLL circuit becomes stable and thus it becomes in locked state under the undesirable state as shown in FIG. 6 B2 or FIG. 6 C2. That is, the PLL circuit is at a false or pseudo stable state. Such a false or pseudo stable state, of course, adversely affects a precision of synchronization of the PLL circuit.

SUMMARY OF THE INVENTION

It is an object of the present invention to provide a PLL circuit in which the problem as described above is solved and the precision of synchronization is improved.

It is another object of the present invention to provide a PLL circuit in which the precision of the synchronization is improved and a time required to attain the phase synchronization, so-called lock-in time, is reduced.

With the above objects, the present invention provides a phase-locked loop circuit for obtaining an output in phase with an incoming signal, which comprises a phase comparator arranged to compare phases of incoming two pulse signals and to produce an output signal, only during a time of predetermined length in every period of one of said incoming two pulse signals, said output signal being at a level changing according to a level of the other one of said two pulse signals; a controlled oscillator arranged to produce an output frequency which is controlled, depending upon the output signal of said phase comparator; and means arranged to form a pulse signal having constant pulse width and frequency relating to the output frequency of said oscillator and to feed said pulse signal to said phase comparator as said other one of said two pulse signals.

Owing to the provision of the means arranged to feed the pulse signal having constant pulse width and frequency relating to the output frequency of the oscillator to the phase comparator, it is possible to avoid the occurrence of the false locked state of the PLL circuit in case where the two incoming pulse signals have great difference in frequency.

The other objects and characteristic features will be understood from the description of the preferred embodiments of the present invention, which will be made with reference to the drawings.

DETAILED DESCRIPTION OF THE PREFERRED EMBODIMENTS

Now, the preferred embodiments of the present invention will be described, with reference to the drawings.

Figure 1:
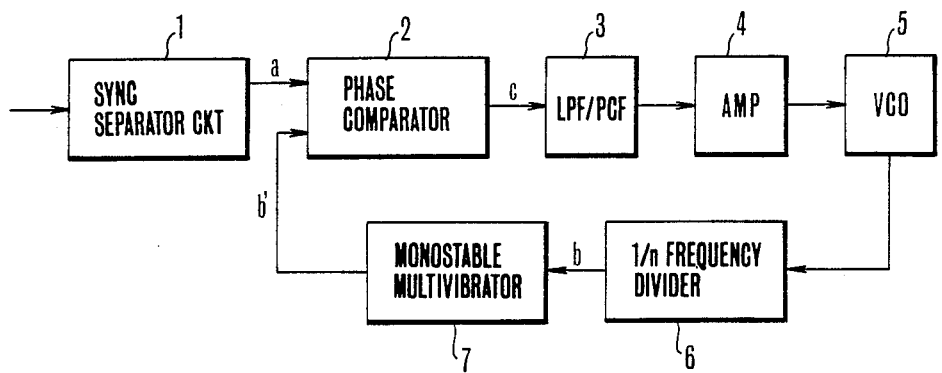
FIG. 1 is a block diagram showing an embodiment of the PLL circuit according to the present invention.
Figure 2:
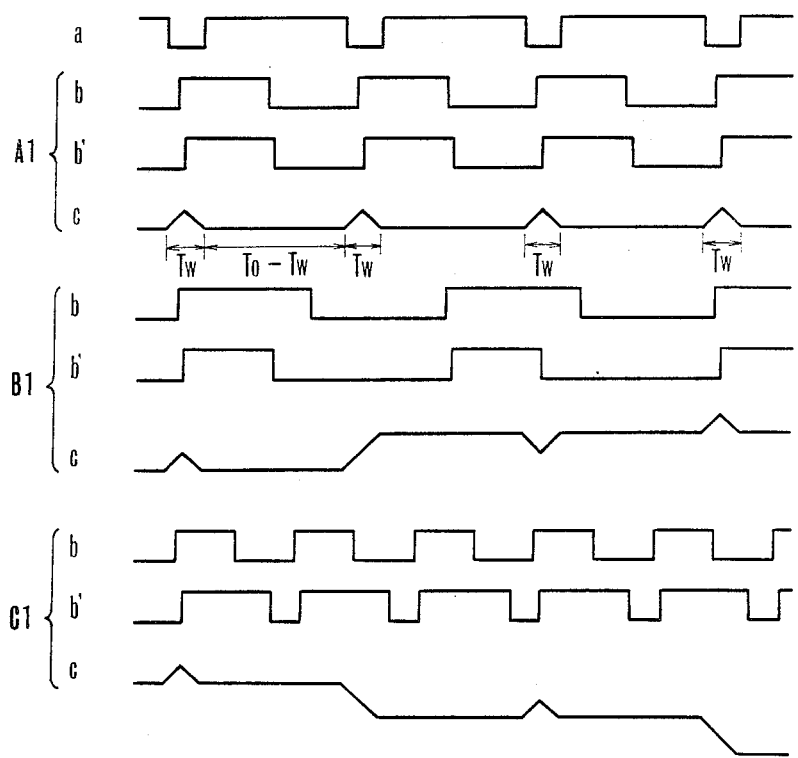
FIG. 2 is a timing chart showing wave forms of signals at several parts in FIG. 1.

FIG. 1 is a block diagram showing an embodiment of the present invention and FIG. 2 is a timing chart showing wave forms of signals at several parts in FIG. 1.

Figure 5:
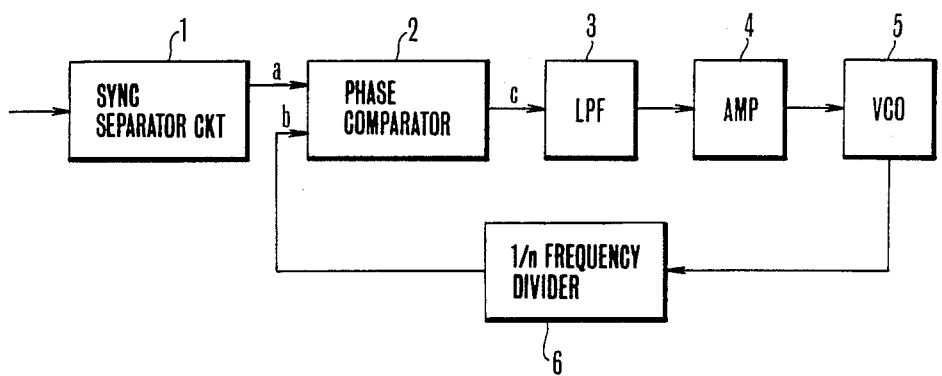
FIG. 5 is a block diagram showing a conventional PLL circuit.
Figure 6:
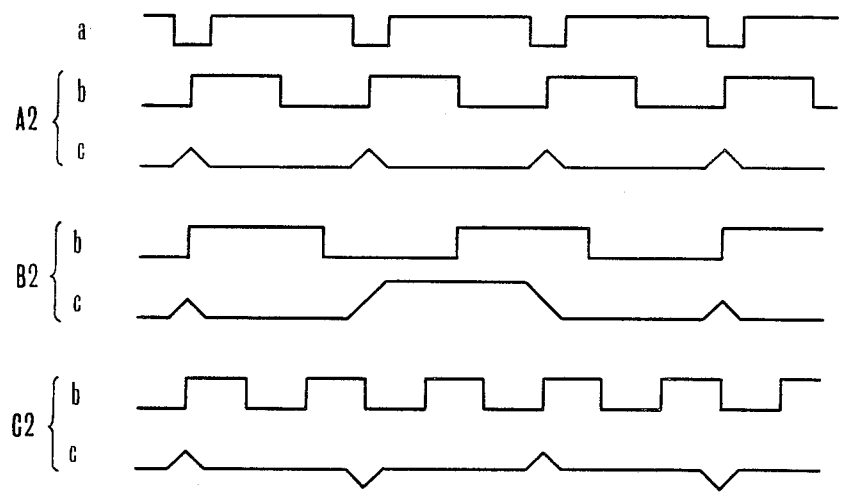
FIG. 6 is a timing chart showing wave forms of signals at several parts in FIG. 5.

The circuit shown in FIG. 1 includes a monostable multivibrator 7 which produces an output signal which becomes at H (high) level for a predetermined time in synchronized relation to a drop-off of an incoming signal. The circuit further includes same components as those shown in FIG. 5 and these components are indicated by same numerals and symbols as used in FIG. 5.

Referring to FIG. 1, it is now assumed that a video signal, for example a NTSC signal, is fed into the synchronizing separator circuit 1. The circuit 1 operates to separate a horizontal synchronizing signal and to feed a signal (a) to the phase comparator 2. The signal (a) becomes at L (low) level for a predetermined time, in synchronized relationship with a drop-off of the horizontal synchronizing signal, as shown in FIG. 2. The phase comparator, which received the signal (a), produces an output voltage signal (c), which becomes lower during a period when another incoming signal (b') is at H (high) level while said signal (a) is at L level and which becomes higher during a period when said another incoming signal (b') is at L level while the signal (a) is at L level. The level of the signal (c) varies, depending upon the signals (a) and (b') and said signal (c) is transmitted through the LPF/PCF 3 and the AMP 4 to the VCO 5, which is driven thereby. The VCO 5 operates to produce an oscillation at a frequency which is 260 times, for example, as large as the frequency of the horizontal synchronizing signal of the incoming signal and, on the other hand, the succeeding frequency divider 6 operates to frequency-divide the oscillation frequency of said VCO 5 to 1/260, thereby producing a frequency-divided signal (b). The monostable multivibrator 7 at the succeeding stage operates to produce a pulse signal, which is at H level for a predetermined time in synchronized relationship with a rise of the pulse signal (b) coming from the frequency divider 6, that is a pulse signal having a constant pulse width, and said pulse signal is fed to the above-mentioned phase comparator 2 as the above-mentioned another incoming signal (b'). This monostable multivibrator 7 produces the output signal in synchronized relationship with the rise of the signal (b) to such extent that it does not come out of phase with the period of the signal (a) even though a variation to some extent may exist owing to an error.

Now, it is assumed that the VCO 5 produces an output signal of a frequency which is in unlocked state in the PLL circuit as shown in FIG. 1 and the output signal of the phase comparator 2 has a wave form as shown at (c) in FIG. B1 or FIG. C1. In the unlocked state, the integrated output of the phase comparator 2 gradually changes, until the output of the phase comparator 2 and the output of the frequency divider 6 attain the states as shown in FIG. A1, so that the circuit becomes into the desired locked state.

That is, according to the embodiment as described above, the monostable multivibrator 7 is driven by the frequency-divided output of the frequency divider 6, so that the phase comparison is effected between the incoming reference signal and the pulse signal which constantly has the predetermined pulse width irrespective of the output frequency of the VCO 5. Accordingly, even in the state as indicated by the wave forms shown in FIG. B1 and FIG. C1, the occurrence of the false locked state is avoided.

In the embodiment as described above, use is made of the monostable multivibrator. In general, a monostable multivibrator includes a resistor and a capacitor. Owing to the use of these element, it becomes necessary to provide an externally mounted element (which is the capacitor element) when the circuit is constructed in the form of an integrated circuit.

Figure 3:
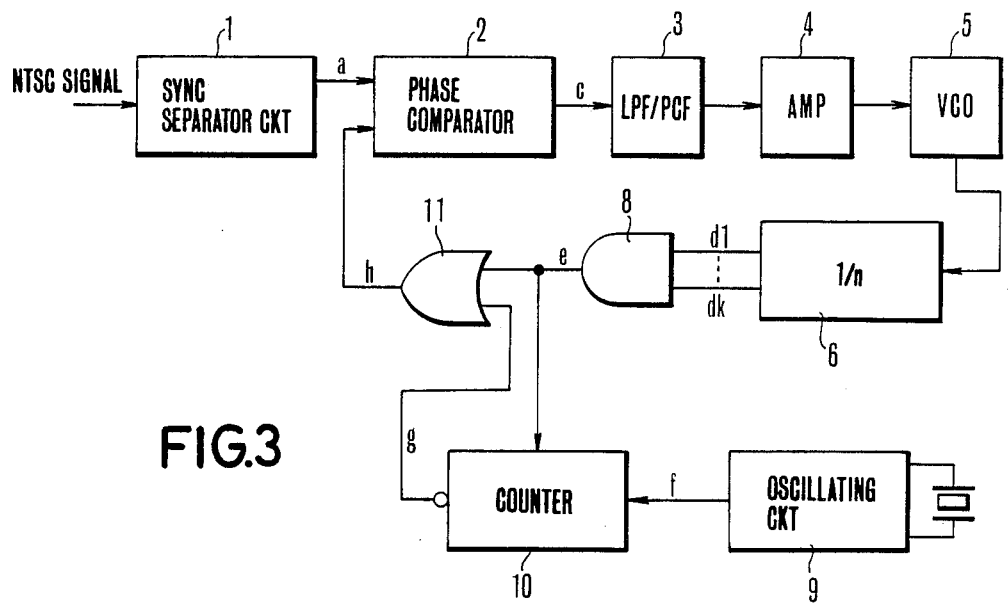
FIG. 3 is a block diagram showing another embodiment of the PLL circuit according to the present invention.

FIG. 3 illustrates another embodiment of the present invention in which the use of such externally mounted element is avoided. FIG. 3 is a block diagram showing the circuit according to this embodiment. In FIG. 3, the same parts as shown in FIG. 1 are indicated by same numerals and symbols as those used in FIG. 1.

The circuit as shown in FIG. 3 includes an AND circuit 8, an oscillating circuit 9 having a free running clock, for example, consisting of a quartz crystal unit of 14M, a counter 10 having a terminal to which an output of said oscillating circuit 9 is fed as a clock signal and a reset terminal to which an output of the AND circuit 8 is fed, and an OR circuit 11. A carrier signal of said counter 10 is inverted and fed to said OR gate 11 as a signal indicated by (g).

Figure 4:
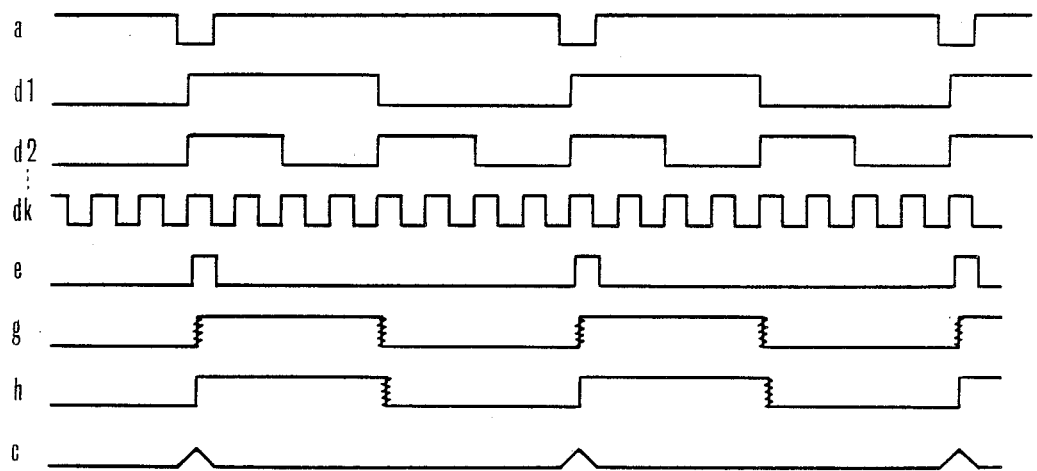
FIG. 4 is a timing chart showing wave forms of signals at several parts in FIG. 3.

FIG. 4 illustrates wave forms of signals at several parts in the circuit shown in FIG. 3.

Referring to the circuit as shown in FIG. 3, it is now assumed that a duty of an output of the frequency divider 6 is changed, and a pulse signal (e) fed from the VCO 5 and having a decreased time at its H (high) level and an output pulse signal (f) of the oscillating circuit 9 are fed into the counter 10. Then, the counter 10 operates to count a predetermined number of pulses of the output pulse signal (f) of the oscillating circuit 9 from the rise thereof and to produce an output signal as shown in FIG. 4 (g). It is desirable that the output signal of the counter 10 may rise in synchronized relationship with the rise of the pulse signal (e). In fact, however, the counter 10 does not always start its operation in synchronized relationship with the rise of the pulse signal (e), since the output pulse signal (f) of the oscillating circuit 9 is not synchronized with the signal (a). Under such circumstances, the output pulse signal (g) includes portions having lower precision in phase, at its rise and drop-off parts, as indicated by zig-zag lines in FIG. 4. According to the circuit as shown in FIG. 3, the pulse signal (e) and the pulse signal (g) are fed into the OR circuit 11 and the output signal of this OR circuit 11 is fed into the phase comparator 2. Thus, an output signal (c) of the phase comparator 2, which is substantially equal to that of the embodiment as shown in FIG. 1, can be obtained unless the oscillating frequency of the VCO 5 is extremely low.

Thus, the circuit arrangement as shown in FIG. 3 provides similar technical advantage to that of the circuit arrangement as shown in FIG. 1, without requiring the provision of any externally mounted element when it is formed as an integrated circuit.

Now the internal construction of the phase comparator as indicated by the numeral 2 in FIG. 1 will be described with reference to FIG. 7.

Figure 7:
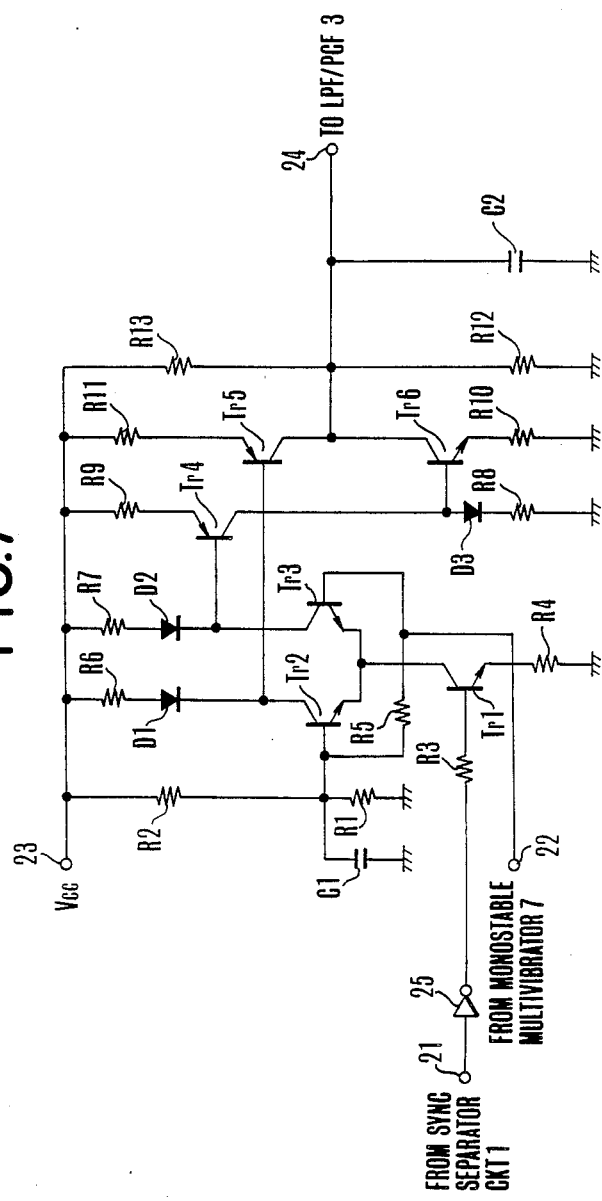
FIG. 7 is a circuit diagram of a phase comparator shown in FIG. 1.

The circuit as shown in FIG. 7 includes resistors R1–R13, capacitors C1–C2, diodes D1–D3, and transistors Tr1–Tr6. A terminal 21 receives a pulse signal, which becomes at L level for a predetermined time, from the synchronizing separator circuit 1 as shown in FIG. 1. A terminal 22 receives an output signal of the monostable multivibrator 7. A terminal 23 receives a power voltage Vcc. A terminal 24 feeds out a control voltage, which is fed to the VCO 5 through the LPF/PCF 3 and the AMP 4. An inverter 25 is included to invert the signal coming from the terminal 21.

In the above-mentioned resistors R1–R13, the resistors R1, R2, R12 and R13 are of relatively high resistance values, while the resistors R13–R11 are of relatively low resistance values. The resistance values of the resistors R1 and R2 are so determined that the potential connected to the base of the transistor Tr2 is of a value falling in the range between H level and L level of the voltage fed into the terminal 22.

In the circuit arrangement as described above, when the output of the inverter 25 is at L level, the transistor Tr1 is turned OFF, so that both of the transistors Tr2 and Tr3 are turned OFF. Accordingly, the other transistors Tr4, Tr5 and Tr6 are also turned OFF. Assuming that all of the resistors R12–R13 are of the same resistance value in case where no charge is specifically stored in the capacitor C2, the output voltage produced from the terminal 24 is ½ Vcc. When the output of the inverter 25 is at H level and the output of the monostable multivibrator 7 is also at H level, the transistors Tr1 and Tr3 are turned ON. Accordingly, the transistor Tr4 is turned ON, whereby the transistor Tr6 is also turned ON. Meanwhile, since the transistor Tr2 is in OFF state, the transistor Tr5 is in OFF state. Accordingly, the capacitor C2 is discharged and the dropping voltage as mentioned above is produced at the terminal 24. In the event that the output of the inverter 25 is at H level while the output of the monostable multivibrator 7 is at L level, the transistors Tr1 and Tr2 are turned OFF and the transistor Tr3 is turned OFF. Then, the transistor Tr5 is turned ON and the transistor Tr6 is turned OFF. As the result, the terminal 24 produces a voltage which rises from the voltage which has been charged on the capacitor C2.

With the resistance values of the resistors R6–R11 and the forward current values of the diodes D1 and D2 suitably determined in the circuit arrangement as shown in FIG. 7, the phase comparator producing the output signal having the levels as shown by (c) in FIG. 1 and FIG. 2 is obtained.

In the embodiment as described above, the capacitor C2 is arranged to be charged or discharged by the output of the phase comparator, so that the phase of the potential of the capacitor 2 is delayed relatively to that of the output of the phase comparator. Owing to such delay, the loop as shown in FIG. 1 may cause an oscillation. In the embodiment as described, however, the LPF/PCF 3 effects the phase compensation, whereby such oscillation can be avoided.

According to the embodiment of the PLL circuit as explained with reference to FIG. 7, the control of the VCO 5 within the loop is effected only during the period indicated by TW in FIG. 2, while the VCO 5 is allowed to operate freely according to the potential of the capacitor C2 during the rest of the period indicated by TO–TW. Accordingly, the apparent wasted time is limited to the period TW, so that the wasted time is reduced to TW/TO as compared with the conventional PLL circuit of analog type in which a sample-and-hold circuit is used (sampling is effected in the period TO). Thus the responding speed can be considerably increased.

It will be understood from the above explanation that the present invention provides a phase-locked loop circuit including means for feeding a pulse signal having a predetermined pulse width and a frequency relating to a frequency of an output signal of a controlled oscillator into one of the two inputs of a phase comparator, which can avoid the occurrence of the false locked state, without adversely affecting precision of synchronization.

What is claimed is:

1. A phase-locked loop circuit for obtaining an output in phase with an incoming signal, comprising:
    (a) a controllable oscillator having an oscillation output;
    (b) pulse generating means arranged to generate a pulse signal of predetermined width in synchronized relationship with the oscillation output of said controllable oscillator;
    (c) phase comparing means arranged to compare a phase of the incoming signal with a phase of the pulse signal generated by said pulse generating means and to control the oscillation of said controllable oscillator in accordance with a phase difference between them; and
    (d) designating means connected with said phase comparing means for designating a specific period of time during which said oscillator is substantially controlled by said phase comparing means at every repeating period of said incoming signal.

2. A phase-locked loop circuit according to claim 1, wherein said pulse generating means includes:
    (a) frequency dividing means arranged to frequency-divide said oscillation output; and
    (b) means arranged to generate a pulse signal of predetermined width in synchronized relationship with the oscillation output frequency-divided by said frequency dividing means.

3. A phase-locked loop circuit according to claim 2, wherein said pulse generating means includes a one-shot multivibrator.

4. A phase-locked loop circuit for obtaining an output in phase with an incoming signal, comprising:
    (a) a controllable oscillator having a pulse output signal;
    (b) frequency dividing means arranged to divide a frequency of said pulse output signal of said controllable oscillator;
    (c) a further oscillator;
    (d) a counter which counts the oscillation output of said further oscillator to generate a pulse signal of predetermined width, depending upon an output of said frequency dividing means;
    (e) resetting means arranged to reset said counter in accordance with an output of said frequency dividing means; and
    (f) phase comparing means arranged to compare a phase of the incoming signal and the phase of the output of said counter and to control the oscillation of said controllable oscillator in accordance with a phase difference between them.

5. A phase-locked loop circuit according to claim 4, wherein said phase comparing means includes:

(a) phase difference detecting means for detecting a phase difference between the pulse output of said counter and the incoming signal; and (b) a filter for cutting a high frequency component of an output of said phase difference detecting means.

6. A phase-locked loop circuit according to claim 5, wherein said filter is constructed to effect phase compensation in order to avoid oscillation of said loop circuit.

7. A phase-locked loop circuit for obtaining an output in phase with an incoming signal, comprising:

(a) a controlled oscillator having an output oscillating at a predetermined center frequency;

(b) first generating means arranged to generate a pulse signal in phase with the incoming signal;

(c) frequency dividing means arranged to frequency-divide the output of said controlled oscillator;

(d) second generating means arranged to generate a pulse signal of predetermined width in accordance with an output of said frequency dividing means; and (e) control signal generating means arranged to compare a phase of the pulse signal generated by said first generating means with a phase of the pulse signal generated by said second generating means and to generate a control signal, said control signal corresponding to the phase difference between such pulse signals solely during a period of time corresponding to the pulse width of the pulse signal generated by said first generating means and to be produced at a level for allowing said oscillator to operate freely at the frequency, at the time of the end of said period of time, of said oscillator during a period other than said period of time corresponding to said pulse width, and to control an oscillation frequency of said controlled oscillator according to a phase difference between them.

8. A phase-locked loop circuit according to claim 7, wherein, during said period corresponding to said pulse width of said first generating means said control signal is produced either at a first control level which causes said oscillator to oscillate at a frequency which rises at a predetermined rate or at a second control level which causes said oscillator to oscillate at another frequency which drops at a predetermined rate; and the ratio of a length of time during which the control signal is at the first control level to a length of time during which the control signal is at the second control level is determined by said phase difference.

9. A phase-locked loop circuit according to claim 8, wherein, when said phase difference is zero, the length of time during which said control signal is at said first level is equal to the length of time during which the control signal is at said second level within said period of time corresponding to said pulse width.

10. A phase-locked loop circuit according to claim 7, wherein the average level of said control signal during said period corresponding to said pulse width is determined according to said phase difference.

11. A phase-locked loop circuit according to claim 7, wherein said second generating means includes a monostable multivibrator.

12. A phase-locked loop circuit for obtaining an output in phase with an incoming signal, comprising:

(a) a phase comparator arranged to compare phases of incoming two pulse signals and to produce an output signal, only during a time of predetermined length in every period of one of said incoming two pulse signals, said output signal being at a level changing according to a level of the other one of said two pulse signals;

(b) a controlled oscillator arranged to produce an output frequency which is controlled, depending upon the output signal of the said phase comparator; and (c) means arranged to form a pulse signal having a predetermined pulse width and a frequency relating to the output frequency of said oscillator and to feed said pulse signal to said phase comparator as said other one of said two pulse signals.

13. A phase-locked loop circuit according to claim 12, wherein said means arranged to feed the pulse signal to said phase comparator as the other one of said two incoming pulse signals includes:

(a) frequency dividing means arranged to frequency-divide the oscillation output signal of said oscillator; and (b) means arranged to form said pulse signal having the constant pulse width in accordance with a rise or a drop-off timing of the signal frequency-divided by said frequency dividing means.

* * * * *